United States Patent [19]
Torres

[11] Patent Number: 6,054,848
[45] Date of Patent: Apr. 25, 2000

[54] METHOD AND APPARATUS FOR DETECTING ELECTROMAGNETIC WAVES

[75] Inventor: Alfonso R. Torres, Dayton, Ohio

[73] Assignee: Mission Research Corporation, Dayton, Ohio

[21] Appl. No.: 08/927,145

[22] Filed: Sep. 3, 1997

[51] Int. Cl.[7] .................................................. G01R 21/10
[52] U.S. Cl. ............................ 324/95; 324/105; 219/744
[58] Field of Search ................................ 324/72, 95, 106, 324/457; 340/600; 349/20, 22, 199; 250/331, 332; 219/736, 737, 744

[56] References Cited

U.S. PATENT DOCUMENTS

| | | |
|---|---|---|
| 3,693,084 | 9/1972 | Augustine .................................. 324/95 |
| 4,065,655 | 12/1977 | Wong et al. .............................. 219/737 |
| 4,431,965 | 2/1984 | Asian ........................................ 324/95 |
| 4,467,278 | 8/1984 | Toth et al. ................................ 324/95 |
| 5,010,251 | 4/1991 | Grinberg et al. ......................... 250/332 |
| 5,164,662 | 11/1992 | Emery et al. ............................. 324/158 |
| 5,800,960 | 9/1998 | Boroson et al. .......................... 430/200 |

*Primary Examiner*—Diep N. Do

[57] ABSTRACT

A detector facilitates visualization of electromagnetic radiation, including radio frequency radiation. The electromagnetic radiation is converted to thermal energy by partial absorption of the radiation, and is made visually observable by coupling the pattern of thermal energy to a thermally-responsive imaging surface, such as a liquid crystal display.

29 Claims, 1 Drawing Sheet

U.S. Patent      Apr. 25, 2000      6,054,848
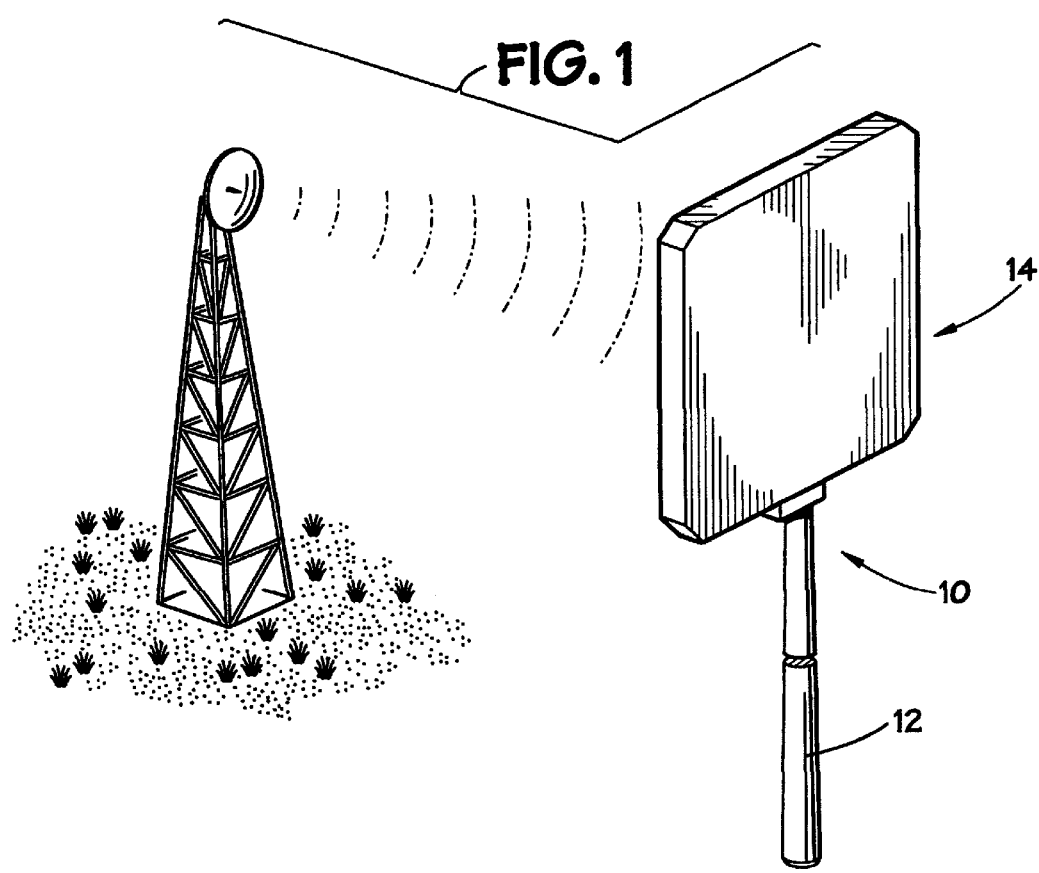
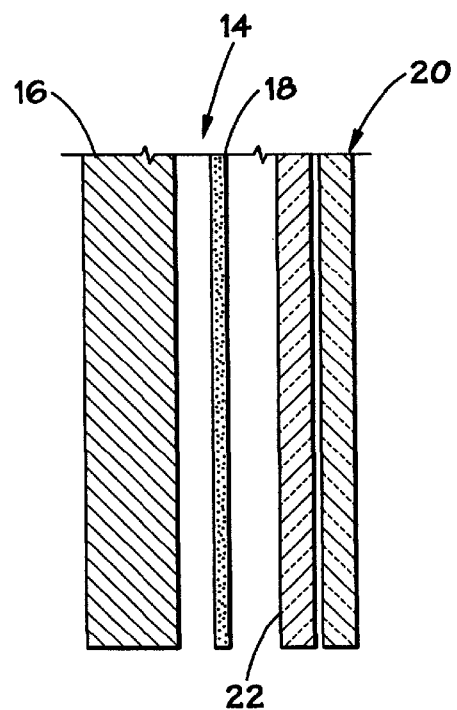

METHOD AND APPARATUS FOR DETECTING ELECTROMAGNETIC WAVES

BACKGROUND OF THE INVENTION

The present invention relates generally to methods and apparatus for visualizing electromagnetic radiation; and, more particularly, relates to methods and apparatus for providing spatial properties of electromagnetic radiation.

Many applications are known wherein it is useful to detect the presence of electromagnetic forces (EMF) such as radio frequency (RF) waves. Devices are known to electrically detect the presence of electromagnetic waves. Such devices typically include electric circuits which are tuned to be sensitive to the presence of electromagnetic waves within selected frequency ranges. Such devices typically suffer from the potential disadvantage that the devices are sensitive to electromagnetic radiation only within a specific frequency range. In many cases, these ranges of sensitivity are extremely narrow. Additionally, conventional devices typically do not allow a user the opportunity to readily determine or visualize the propagation patterns of detected electromagnetic radiation. This is true notwithstanding the fact that such visualization would be extremely useful in many applications, such as detecting leaks from microwave ovens, or in servicing devices such as cellular telephones or other types of communication equipment, including transmitting antennas.

Accordingly, the present invention provides a new method and apparatus whereby electromagnetic radiation, and in particular radio frequency emissions, can be rendered visually detectable; and which can, in selected implementations, be constructed to be sensitive to radiation over a wide range of wavelengths and frequencies. Additionally, such devices may be constructed to detect emissions without regard to waveform or modulation.

SUMMARY OF THE INVENTION

The present invention facilitates imaging of electromagnetic wave propagation. In accordance with the present invention, electromagnetic waves are partially absorbed by a plurality of generally discrete particles forming a generally resistive medium. In one preferred embodiment, the resistive medium will have a sheet resistance 1,000 to 5,000 ohms per square. In a particularly preferred embodiment, the medium will comprises a plurality of carbon particles within a sheet or matrix, placed to yield a sheet resistance of approximately 2,000–3,000 ohms per square. When placed proximate a source of radiation, the carbon particles will absorb a very small portion of the RF radiation and will generate heat in response to such absorption. The energy absorbing medium is placed in thermal communication with a heat responsive imaging surface, for example, a liquid crystal sheet. In one particularly preferred embodiment, the energy absorbing medium is adhesively coupled through a heat conducting medium to the rear surface of a liquid crystal sheet. Heat generated within the medium is transferred to form a visual pattern in the liquid crystal sheet, facilitating detection and observation of radiation patterns.

BRIEF DESCRIPTION OF THE DRAWINGS

FIG. 1 depicts an exemplary embodiment of a electromagnetic radiation detector in accordance with the present invention, illustrated from an oblique perspective.

FIG. 2 depicts a portion of the radiation detector of FIG. 1, illustrated in lateral vertical cross-section.

DETAILED DESCRIPTION OF PREFERRED EMBODIMENTS

Referring now to the drawings in more detail, and particularly to FIG. 1, therein is depicted an exemplary embodiment of an electromagnetic radiation detector 10 in accordance with the present invention. As will be apparent from the discussion to follow, a large variety of sizes and configurations of detectors may be constructed in accordance with the present invention. Electromagnetic radiation detector 10 is described herein in the context of a detector configured to detect radio frequency waves. Radio frequency (or "RF") propagations are generally considered to encompass electromagnetic waves at frequencies between 10 kHz and 100 GHz. Such frequency range is generally considered to be that in which EMF radiation may be detected and amplified as electric current at the wave frequency.

Depicted detector 10 may be constructed in any convenient size. For example, a detecting area of approximately four inches by four inches may be satisfactory for many applications, such as evaluating RF shielding in consumer products. Detector 10 is depicted as having a handle 12 which is coupled to a detecting assembly, indicated generally at 14, to facilitate support and movement of detecting assembly 14 to a desired location and in a desired manner.

Referring now also to FIG. 2, therein is depicted detecting assembly 14 from a lateral view and in vertical section. Detecting assembly 14 preferably includes three primary components. The first component is an energy absorbing material or layer 16, which, for most applications, will be partially transparent to radio frequencies. Energy absorbing material 16 is coupled, such as through a heat conductive adhesive 18 to a thermally responsive visual imaging surface 20. In a preferred implementation, visual imaging surface 20 will comprise a liquid crystal sheet. Typically, liquid crystal sheets are very transparent to radio frequencies. The heat conductive adhesive may be a conventional spray adhesive, such as an aerosol photo adhesive with thermal conductivity.

In a particularly preferred implementation, energy absorbing material 16 includes a matrix of "KAPTON." KAPTON is a polyimide material manufactured by DuPont Chemical Co. The KAPTON is impregnated with carbon particles to a degree sufficient to yield a desired sheet resistance. Typically, the sheet resistance will be between 1,000 and 5,000 ohms per square, and a sheet resistance of 2,000–3,500 ohms per square will be preferred for many applications. In one preferred implementation, a resistivity level of approximately 3,000 ohms per square is desired. As will be appreciated by those skilled in the art, the carbon level within the KAPTON may be adjusted to vary the sheet resistance. The greater the desired sheet resistance, the lower the volume of carbon which will be provided within the KAPTON matrix. The sheet resistance will be selected in response to the power of RF to be detected. For example, the greater the power of the radiation source to be examined, the greater resistivity that can be utilized, and the lower the volume of carbon which is needed.

For many applications it will be preferable that the detector provide minimal interference to the radio waves being detected, so as to allow the waves to propagate substantially unimpeded by detector 10. Accordingly, a material such as carbon impregnated KAPTON is selected because it is relatively transparent to radio frequency waves. Such carbon impregnated KAPTON may be utilized in accordance with the present invention to absorb less than 0.5% of RF energy, and preferably to absorb a range of 0.125–0.25% of RF energy. Materials other than KAPTON may also be utilized within such an absorbency range. For example, a sheet polyester material such as that sold under the tradename "MYLAR," also manufactured by DuPont Chemical Co. may be coated with carbon particles (in a manner similar to that of carbon paper) to provide an alternative energy absorbent layer. Additionally, materials other than carbon may be utilized. Carbon is a desirable RF absorbent for this application because it has a relatively low resistivity, and also will heat generally linearly in a response to absorption of RF radiation. Materials such as nitrides, however, may also be utilized as a RF absorbent medium.

The RF absorbent medium will be selected to yield a thermal imprint which is resolvable by the thermal imaging surfaces. In the case of a liquid crystal imaging surface, a temperature differential of 4–5 degrees of above ambient will typically be satisfactory.

In operation, radio frequency emissions will contact the carbon particles in the KAPTON sheet or other surface, and will generate an incremental amount of heat in the particles. This heat is then transferred through adhesive 18 to the rearward surface 22 of liquid crystal sheet 20. Liquid crystal sheet 20 is responsive to the heat differential, and will transfer the pattern of the heat generated within the energy absorbing layer, thereby allowing the pattern of the impinging radio waves to viewed.

Liquid crystal sheet 20 may have an operating temperature range between approximately 77° F. and 86° F. However, as is known to those skilled in the art, liquid crystal is manufactured in a variety of operating temperature ranges and other operating ranges may be used, as desired. If, for example, a detector was intended to be used outside, or in another potentially warm environment, then liquid crystal having range of approximately 88° F.–100° F. might be selected. Liquid crystal media will typically be able to resolve a thermal image in an ambient below the designated operating range.

Many modifications and variation may be made in the techniques and structures described and illustrated herein without departing from the spirit and scope of the present invention. Accordingly, it should be readily understood that the embodiments described herein are illustrative only and are not to be as limitations upon the scope of the present invention.

I claim:

1. An apparatus for detecting a range of frequencies of electromagnetic radiation, comprising:

an electromagnetic radiation-absorbing material operable to generate heat from absorbed electromagnetic radiation, said radiation-absorbing material configured to absorb no more than 0.5% of electromagnetic radiation intersecting said material; and a thermally responsive indicator in thermal communication with said radiation-absorbing material.

2. The apparatus of claim 1, wherein said partially electromagnetic absorbing material comprises a plurality of electromagnetic radiation-absorbing particles within a matrix which is generally transparent to electromagnetic radiation.

3. The apparatus of claim 2, wherein said radiation-absorbing particles comprise carbon particles.

4. The apparatus of claim 1, wherein said thermally responsive indicator comprises a liquid crystal sheet.

5. An apparatus configured to provide a visual indication of electromagnetic radiation, comprising:

a first medium comprising a plurality of carbon particles within a matrix material, said first medium having a sheet resistivity of 1,000 to 5,000 ohms per square; and a heat responsive display adhesively coupled to said first medium, and in thermal communication with said first medium.

6. The apparatus of claim 5, wherein said first medium further comprises a polyimide material.

7. The apparatus of claim 6, wherein said polyimide material comprises carbon particles sufficient to establish a sheet resistance between 1,000 and 5,000 ohms per square.

8. The apparatus of claim 5, wherein said heat responsive display comprises a liquid crystal sheet.

9. The apparatus of claim 8, wherein said liquid crystal sheet is adhesively bonded to said first medium.

10. An indicator of multiple frequencies of radio frequency radiation comprising:

a first medium comprising a plurality of carbon particles and having a sheet resistance of 1,000 to 5,000 ohms per square, said first medium having a first inner surface; and a display medium comprising a liquid crystal sheet, said display medium coupled to said first medium with said liquid crystal sheet in thermal communication with said first inner surface of said first medium.

11. The indicator of claim 10, wherein said first medium comprises a polyimide material, and wherein said carbon particles are embedded in said polyimide material.

12. The indicator of claim 10, wherein said first medium comprises a polyester material, and wherein said carbon particles are embedded in said polyester material.

13. The indicator of claim 10, wherein said first medium is formed as a generally planar element, and wherein said liquid crystal sheet is formed as a generally planar element.

14. The indicator of claim 10, wherein said display medium is adhesively bonded to said first medium.

15. A method of detecting electromagnetic radiation, comprising the steps of:

converting at least a portion of said electromagnetic radiation to thermal energy; and converting said thermal energy to a visual image.

16. The method of claim 15, wherein said step of converting is performed through steps comprising intersecting said electromagnetic radiation with a material which absorbs a portion of said electromagnetic radiation and generates heat in response thereto.

17. The method of claim 16, wherein said step of converting said thermal energy to a visual image is performed through steps comprising transferring a thermal energy pattern generated by said element intersecting said electromagnetic radiation to a thermally-responsive surface.

18. The method of claim 17, wherein said thermally-responsive surface comprises a liquid crystal sheet.

19. A method of detecting radiation patterns of electromagnetic radiation over a range of frequencies, comprising the steps of:

intersecting said electromagnetic radiation with a material selected to absorb said radiation and to generate thermal energy in a pattern generally corresponding to the pattern of said electromagnetic radiation, said material having a resistivity selected to absorb no more than 0.5% of said electromagnetic radiation intersecting said material; and providing a visual image of said thermal energy pattern.

20. The method of claim 19, wherein said surface comprises particles which absorb a portion of said electromagnetic radiation, said material having a sheet resistance of at least 1,000 ohms per square.

21. The method of claim 19, wherein said material has a surface which is adjacent to a heat imaging surface.

22. The method of claim 19, wherein said heat imaging surface comprises a liquid crystal sheet.

23. A method of detecting radio frequency emissions over a range of frequencies, comprising the steps of:

intersecting said radio frequency emissions with a first material having a plurality of carbon particles distributed therein, the density of said plurality of carbon particles selected to absorb no greater than 0.5% of said radio frequency emissions and to generate heat in response to said absorption; and placing a liquid crystal sheet in thermal communication with said first material to provide a visual indicator of said radio frequency emissions.

24. The method of claim 23, wherein said intersecting material is formed to have a sheet resistance of 2,000–3,000 ohms per square.

25. The method of claim 23, wherein said liquid crystal sheet is adhesively bonded to said intersecting material.

26. The method of claim 23, wherein said intersecting material comprises carbon.

27. The method of claim 23, wherein said intersecting material comprises nitride.

28. A method of manufacturing a broad band radio frequency detector, comprising the steps of:

providing a first material having a plurality of carbon particles therein, said first material having a first surface, said first material having a sheet resistance of 1,000 to 5,000 ohms per square;

providing a sheet of liquid crystal, said liquid crystal sheet having a second surface; and coupling said first material to said liquid crystal sheet with said first and second surfaces placed in generally opposed adjacent relation to one another.

29. The method of claim 28, wherein said first material is adhesively bonded to said liquid crystal sheet.

\* \* \* \* \*